(12) United States Patent
Lee

(10) Patent No.: US 9,368,175 B2
(45) Date of Patent: Jun. 14, 2016

(54) SEMICONDUCTOR MEMORY DEVICE RECEIVING MULTIPLE COMMANDS SIMULTANEOUSLY AND MEMORY SYSTEM INCLUDING THE SAME

(71) Applicant: SK hynix Inc., Gyeonggi-do (KR)

(72) Inventor: Dong-Uk Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/493,026

(22) Filed: Sep. 22, 2014

(65) Prior Publication Data
US 2015/0098284 A1    Apr. 9, 2015

(30) Foreign Application Priority Data
Oct. 7, 2013   (KR) .................. 10-2013-0118898

(51) Int. Cl.
G11C 8/18    (2006.01)
G11C 7/22    (2006.01)
G11C 8/12    (2006.01)

(52) U.S. Cl.
CPC .. G11C 8/18 (2013.01); G11C 7/22 (2013.01); G11C 8/12 (2013.01)

(58) Field of Classification Search
USPC ......................................... 365/193, 194, 203
See application file for complete search history.

(56) References Cited

U.S. PATENT DOCUMENTS

| 6,553,449 B1 | 4/2003 | Dodd et al. |
| 2003/0099142 A1* | 5/2003 | Cowles ............... G11C 7/1015 365/200 |
| 2003/0135699 A1* | 7/2003 | Matsuzaki .......... G06F 13/1605 711/149 |

FOREIGN PATENT DOCUMENTS

KR    100699810    3/2007

* cited by examiner

Primary Examiner — Hoai V Ho
(74) Attorney, Agent, or Firm — IP & T Group LLP

(57) ABSTRACT

A semiconductor memory device may include: a memory cell array; a first address controller configured to receive a first command and a first address and generate a first control signal in response to the first command; and a second address controller configured to receive a second address and a second command inputted at the same time as the first command, and generate a second control signal in response to the second command.

19 Claims, 13 Drawing Sheets

<PRIOR ART>

SEMICONDUCTOR MEMORY DEVICE RECEIVING MULTIPLE COMMANDS SIMULTANEOUSLY AND MEMORY SYSTEM INCLUDING THE SAME

CROSS-REFERENCE TO RELATED APPLICATIONS

The present application claims priority of Korean Patent Application No. 10-2013-0118898, filed on Oct. 7, 2013, which is incorporated herein by reference in its entirety.

BACKGROUND

1. Field

Various exemplary embodiments of the present invention relate to a semiconductor memory device capable of receiving row and column commands through an independent bus, and performing a dual command addressing operation, and a memory system including the same.

2. Description of the Related Art

FIG. 1 is a timing diagram illustrating an operation of a conventional semiconductor memory device.

The conventional semiconductor memory device cannot receive a row command such as an active or precharge command, and a column command such as a read or write command at the same time, and should receive them in conformity with a predetermined timing condition.

For example, in order to perform a read or write operation, and an active operation for a bank, the conventional semiconductor memory device should receive the read or write command for the bank a time period of tRCD (RAS-CAS Delay) after the active command for the bank. Furthermore, in order to perform a precharge operation, and a read operation for a bank, the conventional semiconductor memory device should receive a precharge command for the bank a time period of tRTP (Read-To-Precharge) after the read command for the bank.

That is, the conventional semiconductor memory device can normally perform the operations only when it receives the row and column commands in conformity with the timing condition such as the tRCD and tRTP, and it cannot perform the operations when it receives the row and column commands at the same time, as illustrated in FIG. 1.

SUMMARY

Various exemplary embodiments of the present invention are directed to a semiconductor memory device capable of supporting an operation mode, in which first and second commands are simultaneously inputted through an independent bus, and a memory system including the same.

In an embodiment, a semiconductor memory device may include: a memory cell array; a first address controller configured to receive a first command and a first address and generate a first control signal in response to the first command; and a second address controller configured to receive a second address and a second command inputted at the same time as the first command, and generate a second control signal for controlling the memory cell array in response to the second command.

In an embodiment, a memory system may include: a memory controller; a semiconductor memory device; and a bus including a first command bus configured to transmit a first command of the memory controller to the semiconductor memory device and a second command bus configured to transmit a second command of the memory controller to the semiconductor memory device. The memory controller may simultaneously provide first and second commands to the semiconductor memory device through the first command bus and the second command bus.

DETAILED DESCRIPTION

Figure 1:
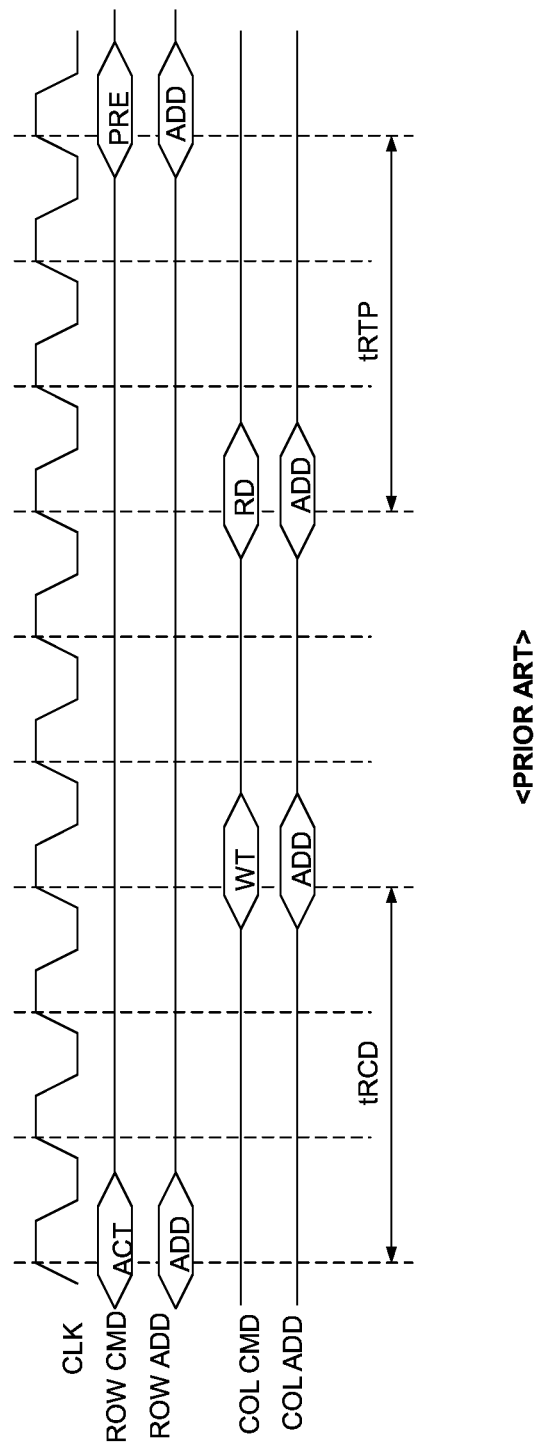
FIG. 1 is a timing diagram illustrating an operation of a conventional semiconductor memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

As well as supporting a conventional operation mode, in which row and column commands are inputted in conformity with timing conditions such as tRCD and tRTP, a semiconductor memory device in accordance with an exemplary embodiment of the present invention may normally perform operations in conformity with the timing conditions even when row and column commands are inputted at the same time in a specific mode (hereafter, referred to as address multiplexing mode). In the address multiplexing mode, the semiconductor memory device may normally perform operations to a bank in conformity with the timing conditions in response to simultaneously inputted row and column commands for the bank.

For example, in the address multiplexing mode, the semiconductor memory device in accordance with an exemplary embodiment of the present invention may normally perform the active and write operations for a bank in conformity with the timing conditions in response to the simultaneously inputted write and active commands for the bank, and the read and precharge operations for a bank in conformity with the timing conditions in response to the simultaneously inputted read and precharge commands for the bank.

Figure 2:
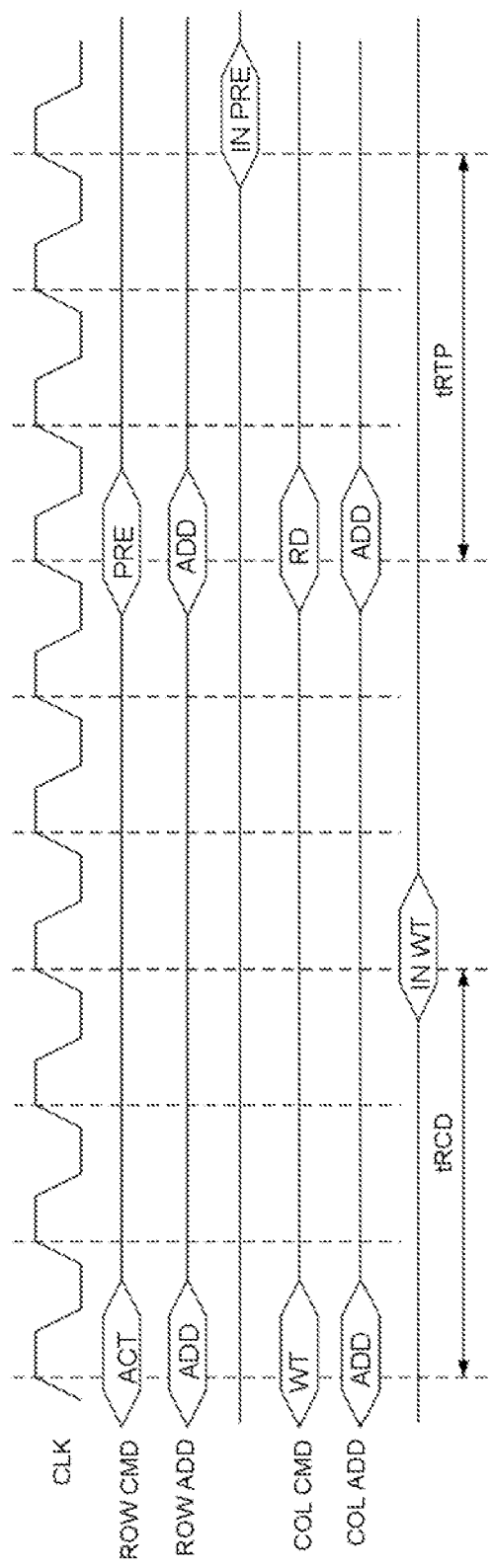
FIG. 2 is a timing diagram illustrating an operation of a semiconductor memory device in accordance with an exemplary embodiment of the present invention.

FIG. 2 may be a timing diagram illustrating an operation of a semiconductor memory device in the address multiplexing mode in accordance with an exemplary embodiment of the present invention.

In the address multiplexing mode, row and column commands may be inputted at the same time, and row and column addresses may be inputted at the same time.

In the timing diagram, a first row command may be the active command, and a first column command may be the write command. In this case, the semiconductor memory device in accordance with an exemplary embodiment of the present invention may generate an internal write command the tRCD after the input of the active command.

In the timing diagram, a second row command may be the precharge command, and a second column command may be the read command. In this case, the semiconductor memory device in accordance with an exemplary embodiment of the present invention may generate an internal precharge command the tRTP after the input of the read command.

As such, the semiconductor memory device in accordance with an exemplary embodiment of the present invention may support the address multiplexing mode by generating the internal commands to satisfy the timing conditions of the row and column commands. The timing condition such as tRCD or tRTP may be set synchronously using a counter and a register such as a mode register within the semiconductor memory device, or asynchronously using a gate delay such as an inverter chain.

Figure 3:
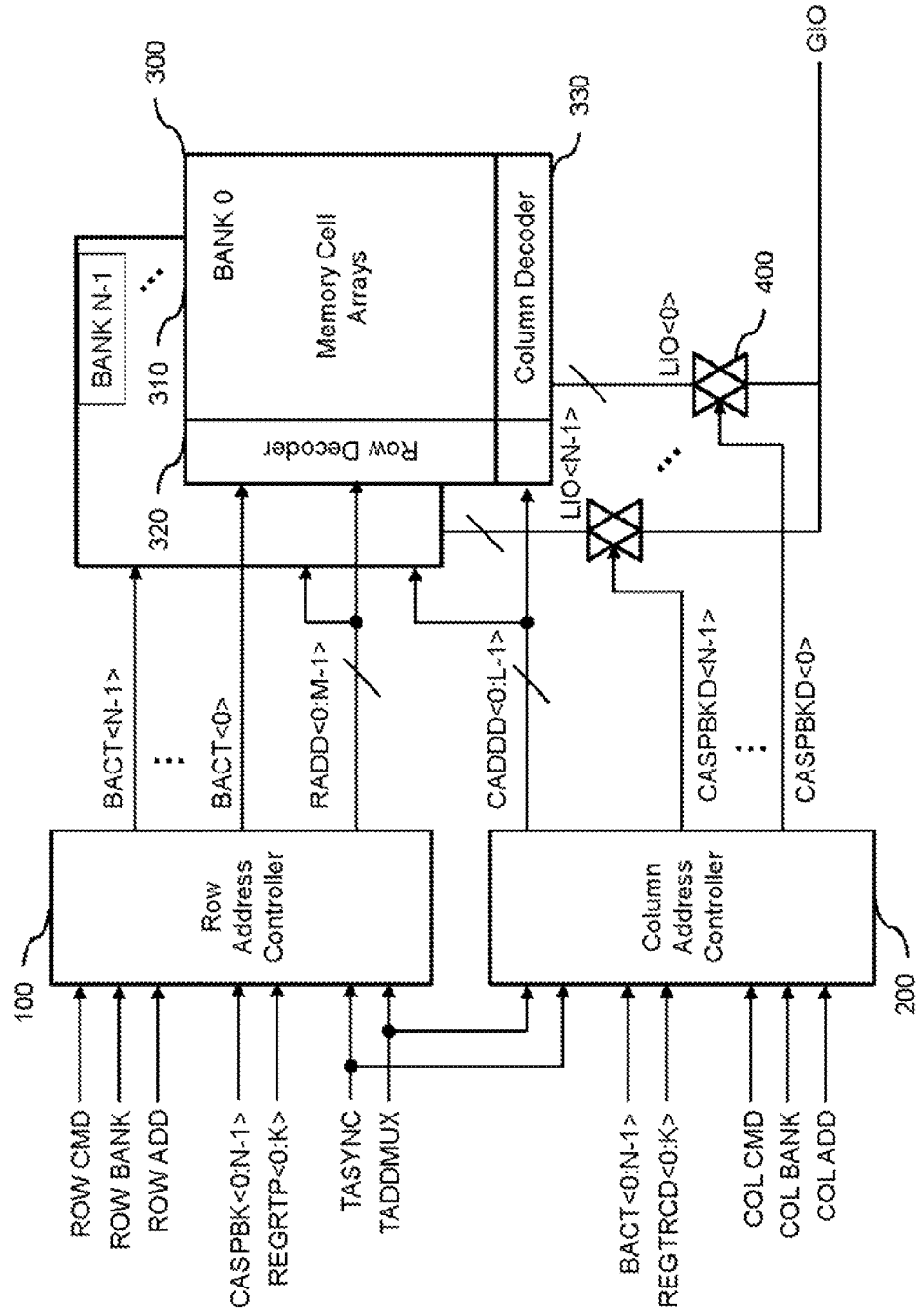
FIG. 3 is a block diagram illustrating a semiconductor memory device in accordance with an embodiment of the present invention.

FIG. 3 is a block diagram illustrating the semiconductor memory device in accordance with an exemplary embodiment of the present invention.

The semiconductor memory device may include a row address controller 100, a column address controller 200, a memory cell region 300, and an input/output switch 400.

The memory cell region 300 may include a memory cell array 310, a row decoder 320, and a column decoder 330. The memory cell region 300 may be divided into a plurality of banks. FIG. 3 shows N banks where N may be a natural number equal to or more than 2, as an example.

Each bank of the memory cell region 300 may be coupled to a global data bus GIO through a local data bus LIO and the input/output switch 400, in order to input/output data.

The row address controller 100 and the column address controller 200 may generate a control signal for transferring data to/from the memory cell region 300. Furthermore, the row address controller 100 and the column address controller 200 may generate a control signal for normally performing operations in the address multiplexing mode.

The row address controller 100 and the column address controller 200 may receive an address multiplexing mode control signal TADDMUX for selecting the address multiplexing mode, and a delay select signal TASYNC for selecting the asynchronous or synchronous way for setting the timing condition such as tRCD and tRTP in the address multiplexing mode. The address multiplexing mode control signal TADDMUX and the delay select signal TASYNC will be described below in detail.

Furthermore, the row address controller 100 may receive a row command ROW CMD, a row bank address ROW BANK, and a row address ROW ADD, which are provided from a memory controller, and a CAS pulse signal CASPBK and a delay amount setting signal REGRTP.

The CAS pulse signal CASPBK may include N bits corresponding to the respective banks. The CAS pulse signal CASPBK may be provided from the column address controller 200.

In the address multiplexing mode, when the CAS pulse signal CASPBK is enabled, the row address controller 100 may asynchronously or synchronously delay the CAS pulse signal CASPBK for setting the timing condition such as tRCD and tRTP in response to the delay select signal TASYNC, and may output a bank active signal BACT.

Figure 5:
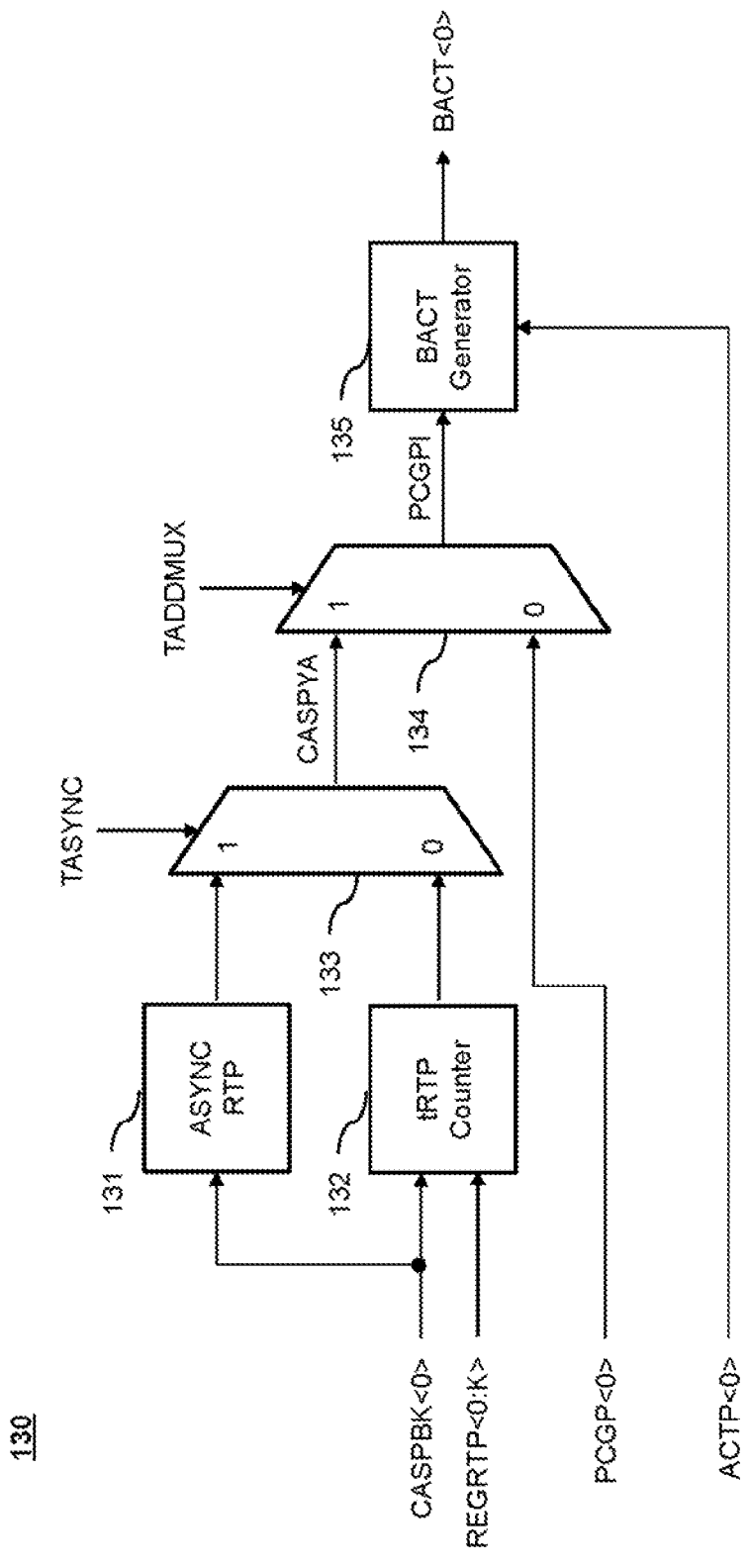
FIG. 5 is a block diagram illustrating a RAS controller shown in FIG. 4.

The delay amount setting signal REGRTP may include multi-bit data, may be previously set and stored in a register such as a mode register, and may be used to reset a tRTP counter 132 within the row address controller 100 as shown in FIG. 5. The tRTP counter 132 may delay the CAS pulse signal CASPBK by counting an internal value of the tRTP counter 132 set by the delay amount setting signal REGRTP.

The column address controller 200 may receive a column command COL CMD, a column bank address COL BANK, and a column address COL ADD, which are provided from a memory controller, and a bank active signal BACT and a delay amount setting value REGTRCD.

Figure 8:
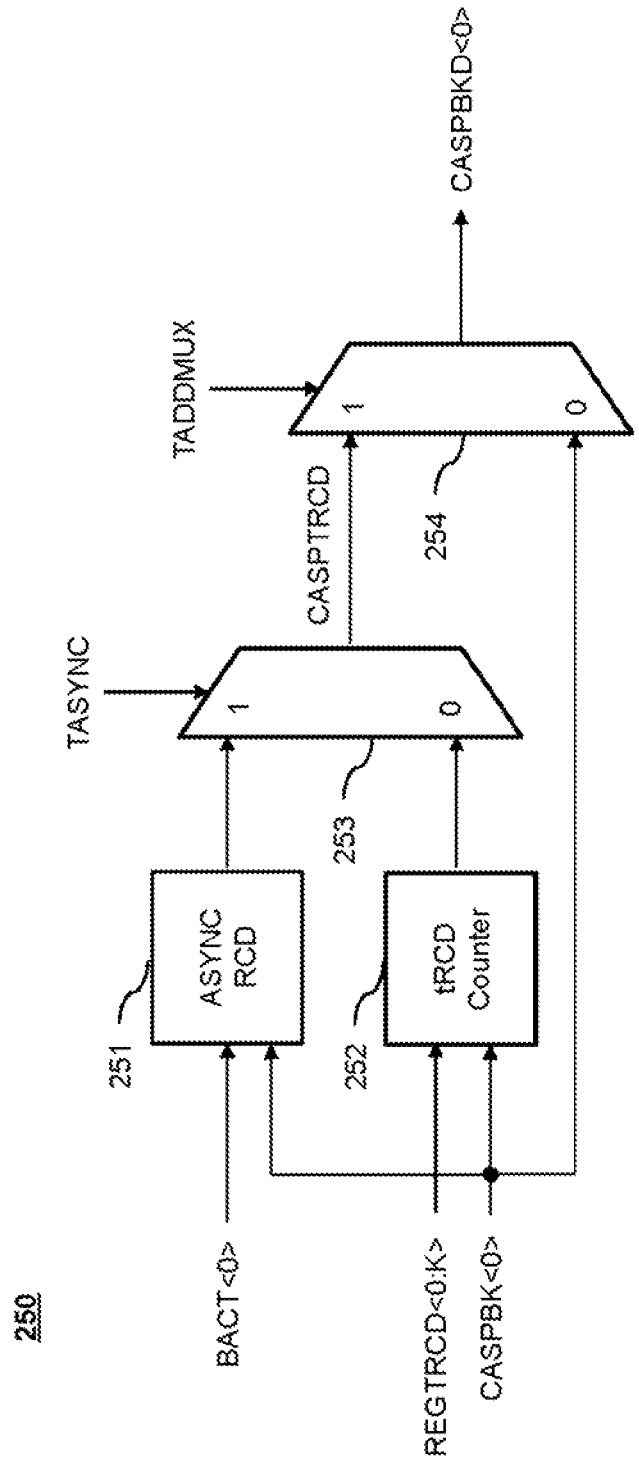
FIG. 8 is a block diagram illustrating a CAS delay controller shown in FIG. 7.

The delay amount setting value REGTRCD may include multi-bit data, may be previously set and stored in a register such as a mode register, and may be used to reset a tRCD counter 252 within the column address controller 200 as shown in FIG. 8. The tRCD counter 252 may delay the CAS pulse signal CASPBK by counting an internal value of the tRCD counter 252 set by the delay amount setting value REGTRCD.

Figure 4:
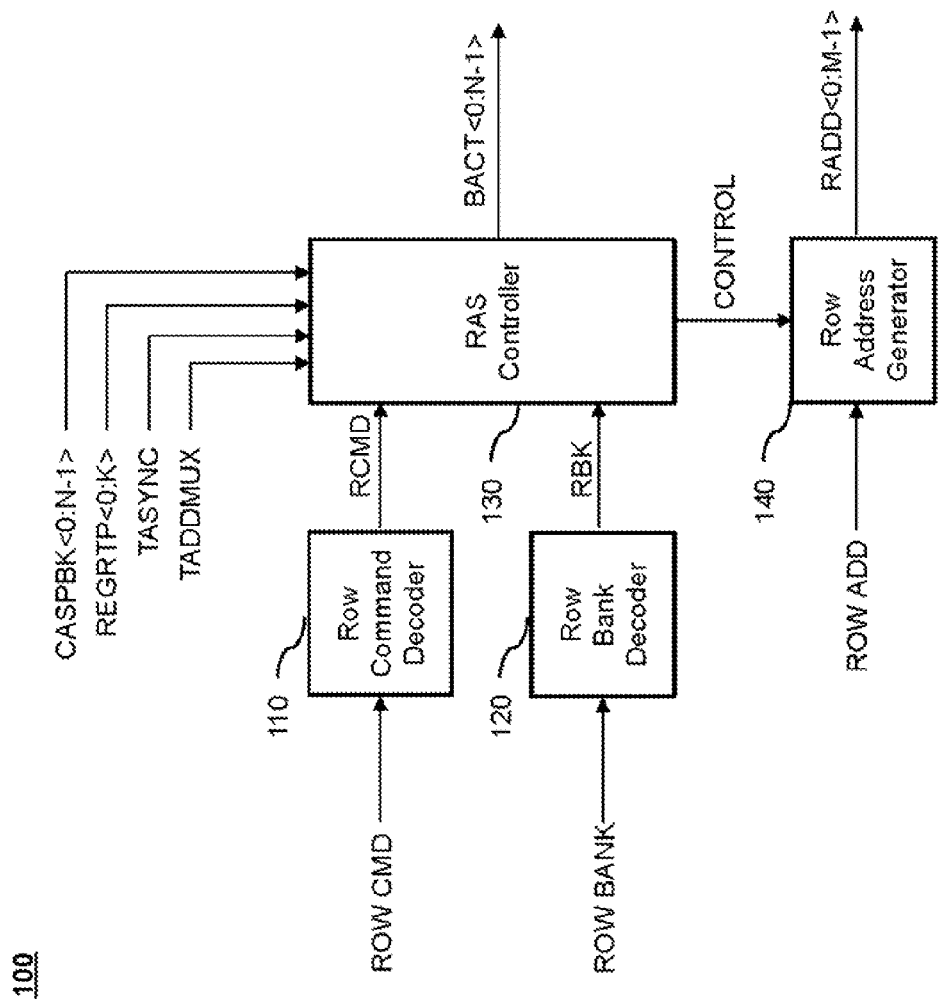
FIG. 4 is a detailed block diagram illustrating a row address controller shown in FIG. 3.

FIG. 4 is a detailed block diagram illustrating the row address controller 100 shown in FIG. 3.

The row address controller 100 may include a row command decoder 110, a row bank decoder 120, an RAS controller 130, and a row address generator 140.

The row command decoder 110 may generate an internal row command RCMD corresponding to the row command ROW CMD by decoding the row command ROW CMD provided from the memory controller. The internal row command RCMD may include an active command ACTP, a precharge command PCGP, and the like.

The row bank decoder 120 may generate a bank control signal RBK corresponding to the row bank address ROW BANK by decoding the row bank address ROW BANK provided from the memory controller. For example, the row bank decoder 120 may output a $2^m$-bit row bank control signal RBK, where m is a natural number, by decoding the m-bit row bank address ROW BANK.

The row address generator 140 may generate an internal row address RADD based on the row address ROW ADD provided from the memory controller. A timing of the internal row address RADD may be controlled by the RAS controller 130.

The internal row address RADD may be aligned in time with the bank active signal BACT. The RAS controller 130 may output a control signal to the row address generator 140 when a logic level of the bank active signal BACT becomes high. The row address generator 140 may generate the internal row address RADD based on the row address ROW ADD in response to the control signal from the RAS controller 130. Thus, the row address generator 140 may provide the internal row address RADD synchronized with the bank active signal BACT.

The RAS controller 130 may generate the bank active signal BACT in response to the internal command RCMD, the bank control signal RBK, the address multiplexing mode signal TADDMUX, the delay select signal TASYNC, the delay amount setting signal REGRTP, and the CAS pulse signal CASPBK.

The CAS pulse signal CASPBK may be transmitted from the column address controller 200. The N-bits CAS pulse signal CASPBK may be independently outputted for the respective banks in response to a column bank signal COL BANK, and may indicate an ongoing operation on the respective banks corresponding to a column command COL CMD, for example, a read, write, or auto precharge operation. The CAS pulse signal CASPBK will be described below in more detail with reference to FIG. 7.

FIG. 5 is a block diagram illustrating the RAS controller 130 shown in FIG. 4.

FIG. 5 shows the RAS controller 130 included in the zero-th bank of the plurality of banks as an example.

The RAS controller 130 may include an asynchronous delay unit 131, the tRTP counter 132, a delay selector 133, an address multiplexing mode selector 134, and a bank active controller 135.

The asynchronous delay unit 131 may delay the CAS pulse signal CASPBK by a predetermined amount of delay. The asynchronous delay unit 131 may include an inverter chain to delay the CAS pulse signal CASPBK for the predetermined amount of delay.

The tRTP counter 132 may include a synchronous delay circuit delaying the CAS pulse signal CASPBK by counting the internal value set by the delay amount setting signal REGRTP, and may transmit the delayed CAS pulse signal CASPBK when the count is completed.

The amount of delay of each of the asynchronous delay unit 131 and the tRTP counter 132 may correspond to the time period of tRTP.

The delay selector 133 may select the delayed CAS pulse signal CASPBK from one of the asynchronous delay unit 131 and the tRTP counter 132 according to the delay select signal TASYNC, and output the selected CAS pulse signal CASPYA, which is the delayed CAS pulse signal CASPBK from one of the asynchronous delay unit 131 and the tRTP counter 132.

The address multiplexing mode selector 134 may select the selected CAS pulse signal CASPYA or the precharge signal PCGP, which is included in the internal row command RCMD, according to the address multiplexing mode signal TADDMUX, and outputs a selected precharge signal PCGPI. In the address multiplexing mode, the address multiplexing mode selector 134 may transfer the selected CAS pulse signal CASPYA, which is the delayed CAS pulse signal CASPBK from one of the asynchronous delay unit 131 and the tRTP counter 132, as the selected precharge signal PCGPI to the bank active controller 135.

The bank active controller 135 may generate the bank active signal BACT in response to one of the active command ACTP, which is included in the internal row command RCMD, or the output of the address multiplexing mode selector 134.

For example, in the address multiplexing mode, when the active command and the write command are simultaneously inputted to the semiconductor memory device, the bank active controller 135 may generate the bank active signal BACT in response to the active command ACTP. The bank active controller 135 may enable the bank active signal BACT to a high level in response to the active command ACTP.

For example, in the address multiplexing mode, when the precharge command and the read command are simultaneously inputted to the semiconductor memory device, the bank active controller 135 may generate the bank active signal BACT in response to the selected CAS pulse signal CASPYA, which is the delayed CAS pulse signal CASPBK from one of the asynchronous delay unit 131 and the tRTP counter 132. The bank active controller 135 may disable the bank active signal BACT to a low level in tRP after the CAS pulse signal CASPBK is enabled.

Also, the RAS controller 130 may generate the bank active signal BACT according to the precharge signal PCGP and the active signal ACTP outputted from the row command decoder 110 in the same manner as a general memory device, during a mode other than the address multiplexing mode.

Figure 6:
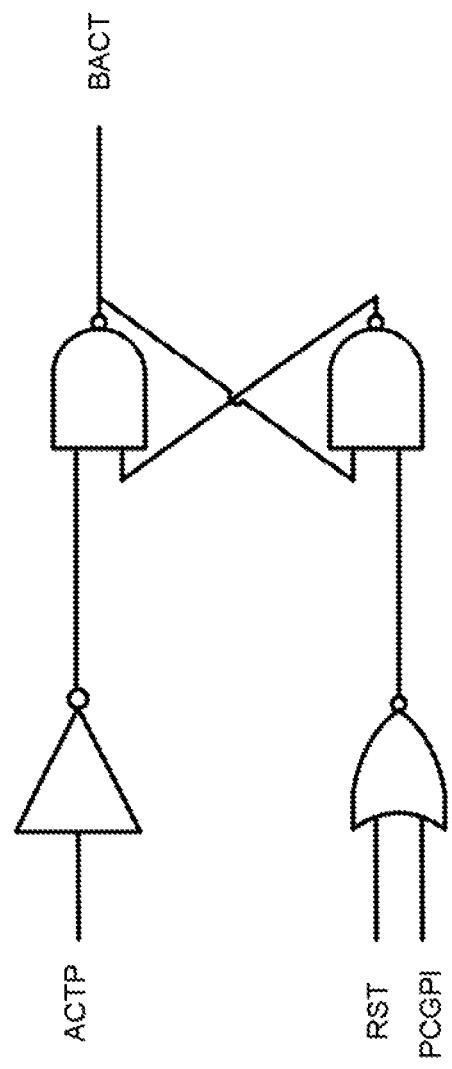
FIG. 6 is a circuit diagram illustrating a bank active controller shown in FIG. 5.

FIG. 6 is a circuit diagram illustrating the bank active controller 135 shown in FIG. 5.

The bank active controller 155 may have a latch structure, which outputs the bank active signal BACT according to the active signal ACTP, the selected precharge signal PCGPI, and a reset signal RST. In the address multiplexing mode, the selected precharge signal PCGPI may be the selected CAS pulse signal CASPYA, which is the delayed CAS pulse signal CASPBK from one of the asynchronous delay unit 131 and the tRTP counter 132.

When the reset signal RST has a logic high level, the bank active signal BACT has the same logic level as the active signal ACTP regardless of the level of the selected CAS pulse signal CASPYA. When the reset signal RST has a logic low level, the level of the bank active signal BACT may be set by a latch operation based on the selected precharge signal PGCPI, and the active signal ACTP.

During the logic low level of the reset signal RST, when the active signal ACTP is enabled, the bank active signal BACT may be enabled, and when the selected precharge signal PGCPI is enabled, the bank active signal BACT may be disabled. As described above, in the address multiplexing mode, when the active command and the write command are simultaneously inputted to the semiconductor memory device, the bank active controller 135 may generate the enabled bank active signal BACT in response to the active command ACTP. On the other hand, in the address multiplexing mode, when the precharge command and the read command are simultaneously inputted to the semiconductor memory device, the bank active controller 135 may generate the disabled bank active signal BACT in response to the selected CAS pulse signal CASPYA, which is the delayed CAS pulse signal CASPBK from one of the asynchronous delay unit 131 and the tRTP counter 132.

Figure 7:
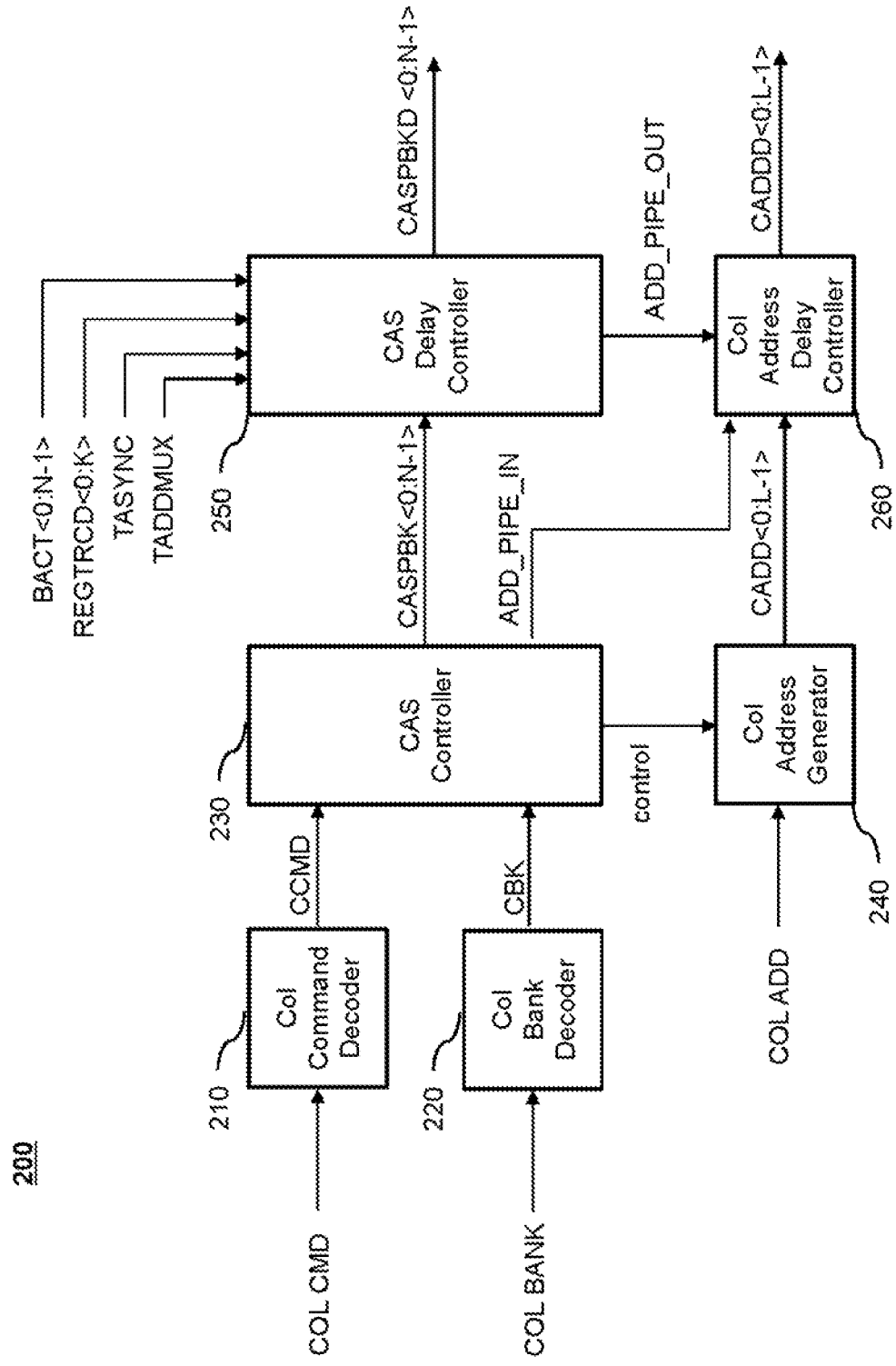
FIG. 7 is a detailed block diagram illustrating a column address controller shown in FIG. 3.

FIG. 7 is a detailed block diagram illustrating the column address controller 200 shown in FIG. 3.

The column address controller 200 may include a column command decoder 210, a column bank decoder 220, a CAS controller 230, a column address generator 240, a CAS delay controller 250, and a column address delay controller 260.

The column command decoder 210 may decode the column command COL CMD provided from the memory controller, and generate an Internal column command CCMD corresponding to the column command COL CMD. The internal column command CCMD may include a read command, a write command, a read with auto-precharge command, and a write with auto-precharge command.

The column bank decoder 220 may decode the column bank COL BANK provided from the memory controller, and generate a column bank control signal CBK corresponding to the column bank COL BANK.

The CAS controller 230 may generate the CAS pulse signal CASPBK for each bank in response to the internal column command CCMD and the column bank control signal CBK. As described above, the N-bits CAS pulse signal CASPBK may be independently outputted for the respective banks in response to a column bank signal COL BANK, and may indicate an ongoing operation on the respective banks corresponding to the column command COL CMD, for example, the read, write, or auto precharge operation. For example, when the internal column command CCMD is a read command for a bank, the CAS pulse signal CASPBK for the bank may be enabled to transmit a column address to the bank during the corresponding read operation. When the internal column command CCMD is a write and auto-precharge command for a bank, the CAS pulse signal CASPBK for the bank may be enabled to transmit a column address to the bank, and the CAS pulse signal CASPTWR for the auto-precharge operation may be enabled after a predetermined time, for example, tWR.

Also, the CAS controller 230 may output an address input timing signal ADD_PIPE_IN aligned in time with the CAS pulse signal CASPBK.

The column address generator 240 may generate an internal column address CADD based on the column address COL ADD inputted from the memory controller. A timing of the internal column address CADD may be controlled by the CAS controller 230.

The internal column address CADD may be aligned in time with the CAS pulse signal CASPBK. The CAS controller 230 may output a control signal to the column address generator 240 when a logic level of the column bank COL BANK high. The column address generator 240 may generate the internal column address CADD based on the column address COL ADD in response to the control signal from the CAS controller 230. Thus, the column address generator 240 may provide the internal column address CADD synchronized with the CAS pulse signal CASPBK.

The CAS delay controller 250 may generate a delayed CAS pulse signal CASPBKD in response to the CAS pulse signal CASPBK, the bank active signal BACT, a delay amount setting value REGTRCD stored in the register such as a mode register, the delay select signal TASYNC, the address multiplexing mode signal TADDMUX.

As described above, in the address multiplexing mode, when the active command and the write command are simultaneously inputted to the semiconductor memory device, the bank active controller 135 may enable the bank active signal BACT in response to the active command ACTP. On the other hand, in the address multiplexing mode, when the precharge command and the read command are simultaneously inputted to the semiconductor memory device, the bank active controller 135 may disable the bank active signal BACT in response to the selected CAS pulse signal CASPYA, which is the delayed CAS pulse signal CASPBK from one of the asynchronous delay unit 131 and the tRTP counter 132.

In the address multiplexing mode, the CAS delay controller 250 may delay the CAS pulse signal CASPBK by a predetermined amount of delay, and output the delayed CAS pulse signal CASPBKD according to the delay select signal TASYNC. For example, when the delay select signal TASYNC is enabled, the CAS delay controller 250 may asynchronously delay the CAS pulse signal CASPBK for the predetermined amount of delay, and output the delayed CAS pulse signal CASPBKD, which will be described in more detail with reference to FIGS. 8 and 9. On the other hand, when the delay select signal TASYNC is disabled, the CAS delay controller 250 may delay the CAS pulse signal CASPBK by counting an internal value set by the delay amount setting value REGTRCD, which will be described in more detail with reference to FIG. 8.

Also, the CAS delay controller 250 may output an address output timing signal ADD_PIPE_OUT aligned in time with the delayed CAS pulse signal CASPBKD.

The column address delay controller 260 may delay the internal column address CADD by a predetermined amount of delay, and output the delayed internal column address CADDD in response to the address input timing signal ADD_PIPE_IN, which is aligned in time with the CAS pulse signal CASPBK, and the address output timing signal ADD_PIPE_OUT, which is aligned in time with the delayed CAS pulse signal CASPBKD.

The column address delay controller 260 may latch the internal column address CADD in response to the address input timing signal ADD_PIPE_IN aligned in time with the CAS pulse signal CASPBK, and output the latched signal as the delayed internal column address CADDD in response to the address output timing signal ADD_PIPE_OUT aligned in time with the delayed CAS pulse signal CASPBKD.

FIG. 8 is a block diagram illustrating the detailed configuration of the CAS delay controller 250 shown in FIG. 7.

FIG. 8 shows the CAS delay controller 250 included in the zero-th bank of the plurality of banks as an example.

The CAS delay controller 250 may include an asynchronous delay unit 251, a tRCD counter 252, a delay selector 253, and an address multiplexing mode selector 254.

The asynchronous delay unit 251 may delay the CAS pulse signal CASPBK by the predetermined amount of delay according to the bank active signal BACT. The asynchronous delay unit 251 may include an inverter chain to delay the CAS pulse signal CASPBK for the predetermined amount of delay.

The tRCD counter 252 may include a synchronous delay circuit delaying the CAS pulse signal CASPBK by counting the internal value set by the delay amount setting value REGTRCD, and may transmit the delayed CAS pulse signal CASPBK when the count is completed.

The amount of delay of each of the asynchronous delay unit 251 and the tRCD counter 252 may correspond to the time period of tRCD.

The delay selector 253 may select the delayed CAS pulse signal CASPBK from one of the asynchronous delay unit 251 and the tRCD counter 252 according to the delay select signal TASYNC, and output the selected CAS pulse signal CASPTRCD, which is the delayed CAS pulse signal CASPBK from one of the asynchronous delay unit 251 and the tRCD counter 252.

The address multiplexing mode selector 254 may select the selected CAS pulse signal CASPTRCD or the CAS pulse signal CASPBK, according to the address multiplexing mode signal TADDMUX, and outputs a delayed precharge signal CSPTKD. During the address multiplexing mode, the address multiplexing mode selector 254 may transfer the selected CAS pulse signal CASPTRCD, which is the delayed CAS pulse signal CASPBK from one of the asynchronous delay unit 251 and the tRCD counter 252, as the delayed CAS pulse signal CASPBKD.

Figure 9:
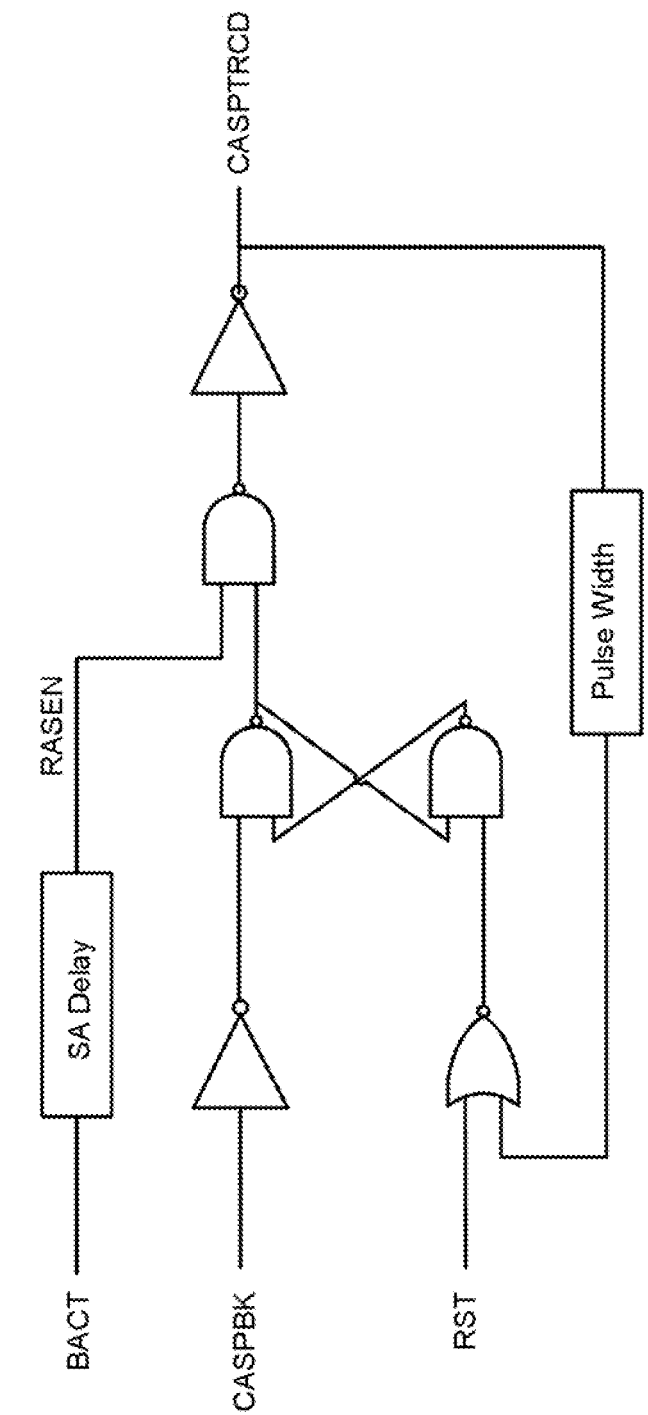
FIG. 9 is a circuit diagram illustrating an asynchronous delay unit shown in FIG. 8.

FIG. 9 is a circuit diagram illustrating the asynchronous delay unit 251 shown in FIG. 8.

The asynchronous delay unit 251 may latch the CAS pulse signal CASPBK.

As described above, in the address multiplexing mode, when the active command and the write command are simultaneously inputted to the semiconductor memory device, the bank active controller 135 may enable the bank active signal BACT in response to the active command ACTP. On the other hand, in the address multiplexing mode, when the precharge command and the read command are simultaneously inputted to the semiconductor memory device, the bank active controller 135 may disable the bank active signal BACT in response to the selected CAS pulse signal CASPYA, which is the delayed CAS pulse signal CASPBK from one of the asynchronous delay unit 131 and the tRTP counter 132.

When the bank active signal BACT is enabled, the asynchronous delay unit 251 may delay the latched CAS pulse signal CASPBK by the predetermined amount of delay, or the amount of tRCD, and may output the selected CAS pulse signal CASPTRCD.

A pulse width of the delayed signal CASPTRCD may be set by a pulse width controller PULSE WIDTH. When the delayed signal CASPTRCD is enabled, the enabled selected CAS pulse signal CASPTRCD, the pulse width of which is controlled by the pulse width controller PULSE WIDTH may be transmitted to the latch so as to reset the output of the latch. Then, the selected CAS pulse signal CASPTRCD becomes disabled.

FIGS. 10 to 13 are timing diagrams illustrating an operation of a semiconductor device in accordance with an embodiment of the present invention.

As described above, in the address multiplexing mode, when the active command and the write command are simultaneously inputted to the semiconductor memory device, the bank active controller 135 may generate the enabled bank active signal BACT in response to the active command ACTP. On the other hand, in the address multiplexing mode, when the precharge command and the read command are simultaneously inputted to the semiconductor memory device, the bank active controller 135 may generate the disabled bank active signal BACT in response to the selected CAS pulse signal CASPYA, which is the delayed CAS pulse signal CASPBK from one of the asynchronous delay unit 131 and the tRTP counter 132.

Figure 10:
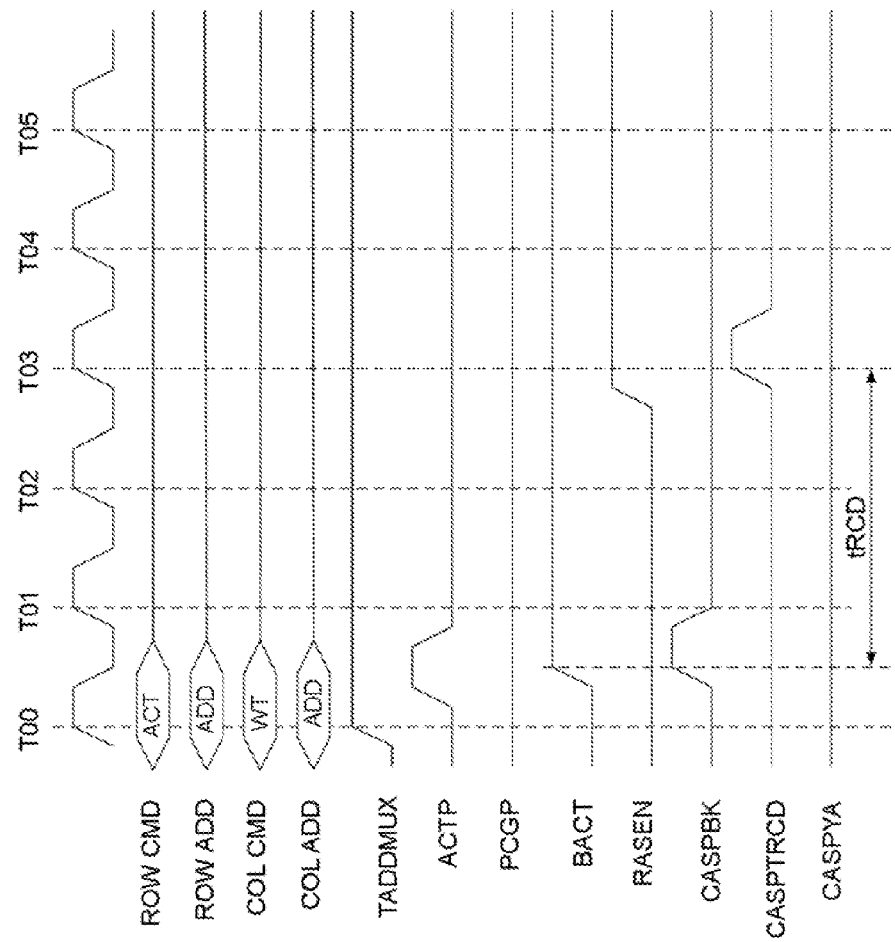
FIGS. 10 to 13 are timing diagrams illustrating an operation of a semiconductor device in accordance with an embodiment of the present invention.

FIG. 10 illustrates that the active and write commands are inputted as the row and column commands for a bank at the same time in the address multiplexing mode, and then the write operation for the bank is performed tRCD after the active operation for the bank.

Figure 11:
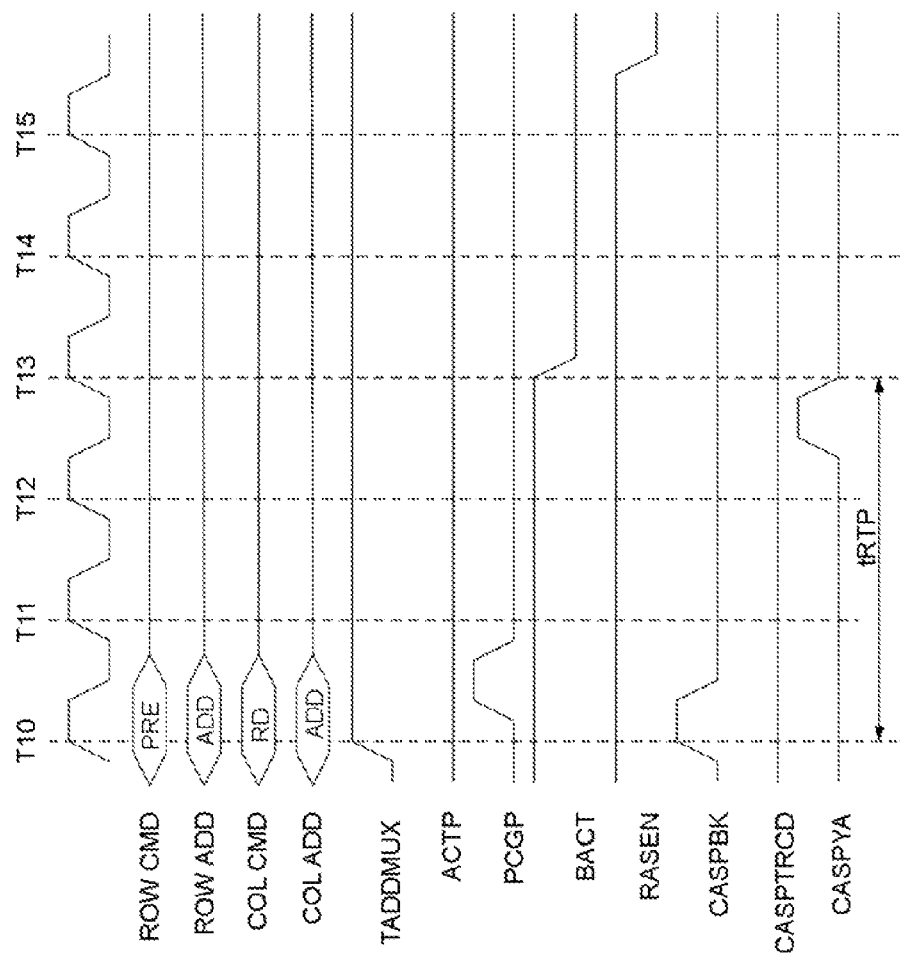

FIG. 11 illustrates that the precharge and read commands are inputted as the row and column commands for a bank at the same time in the address multiplexing mode, and then the precharge operation for the bank is performed tRTP after the read operation for the bank.

Referring to FIG. 10, in the address multiplexing mode, the row command ROW CMD and the column command COL CMD are simultaneously provided to a bank of the semiconductor memory device at T00 and T01, at which the row address ROW ADD and the column address COL ADD may also be provided at the same time.

The row command decoder 110 may decode the row command ROW CMD indicating the active command, and enable the active signal ACTP at T01.

Accordingly, the bank active controller 135 may enable the bank active signal BACT in response to the active signal ACTP. The bank active signal BACT may keep enabled until the selected CAS pulse signal CASPYA, which is the delayed CAS pulse signal CASPBK from one of the asynchronous delay unit 131 and the tRTP counter 132, is enabled.

The column command decoder 210 may decode the column command COL CMD, and enable the internal column command CCMD indicating the write command. The CAS controller 230 may output the enabled CAS pulse signal CASPBK according to the write command at T01.

When the bank active signal BACT is enabled, the asynchronous delay unit 251 within the CAS delay controller 250 may delay the CAS pulse signal CASPBK, and enable the delayed precharge signal CASPBKD tRCD after the enablement of the bank active signal BACT, at T03.

FIG. 11 illustrates that the precharge and read commands for the bank are simultaneously inputted as the row and column commands after the operation shown in FIG. 10, and then the precharge operation for the bank is performed tRTP after the read operation for the bank.

Referring to FIG. 11, the row command decoder 110 may decode the row command ROW CMD indicating the precharge command at T10.

The column command decoder 210 may decode the column command COL CMD, and output an enabled internal column command CCMD indicating the read command. The CAS controller 230 may output the enabled CAS pulse signal CASPBK according to the internal column command at T10.

As described above, in the address multiplexing mode, the address multiplexing mode selector 134 may transfer the selected CAS pulse signal CASPYA, which is the delayed CAS pulse signal CASPBK from one of the asynchronous delay unit 131 and the tRTP counter 132, as the selected precharge signal PCGPI to the bank active controller 135. The bank active controller 135 may generate the bank active signal BACT in response to the output of the address multiplexing mode selector 134. When the precharge command and the read command are simultaneously inputted to the semiconductor memory device, the bank active controller 135 may generate the bank active signal BACT in response to the selected CAS pulse signal CASPYA, which is the delayed CAS pulse signal CASPBK from one of the asynchronous delay unit 131 and the tRTP counter 132. The bank active controller 135 may disable the bank active signal BACT to a low level in tRTP after the CAS pulse signal CASPBK is enabled, as shown at T13 in FIG. 11.

Figure 12:
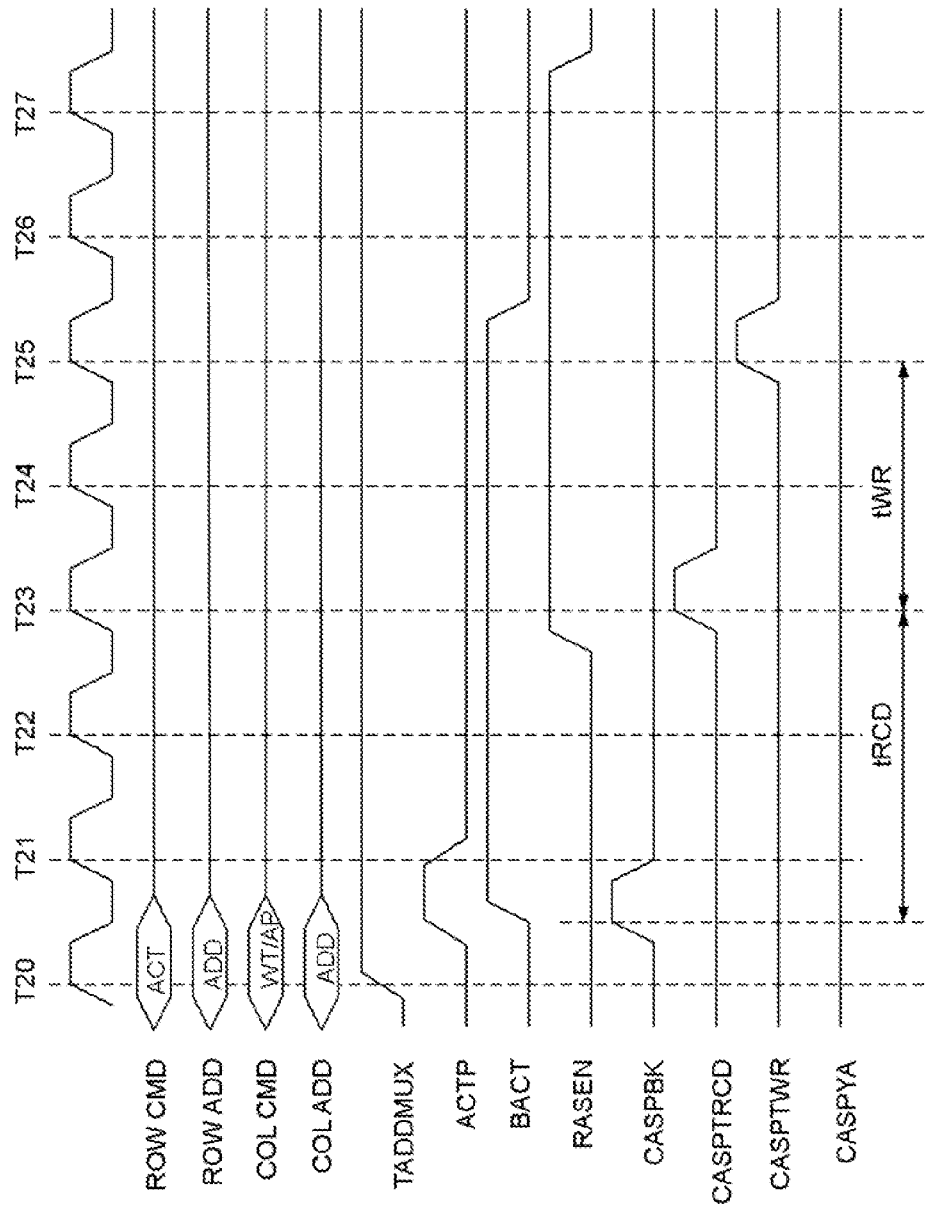

FIG. 12 illustrates that the active and write with auto-precharge commands for a bank are inputted as the row and column commands at the same time, then the write operation for the bank is performed tRCD after the active operation for the bank, and then the auto-precharge operation for the bank is performed tWR after the write operation for the bank.

Figure 13:
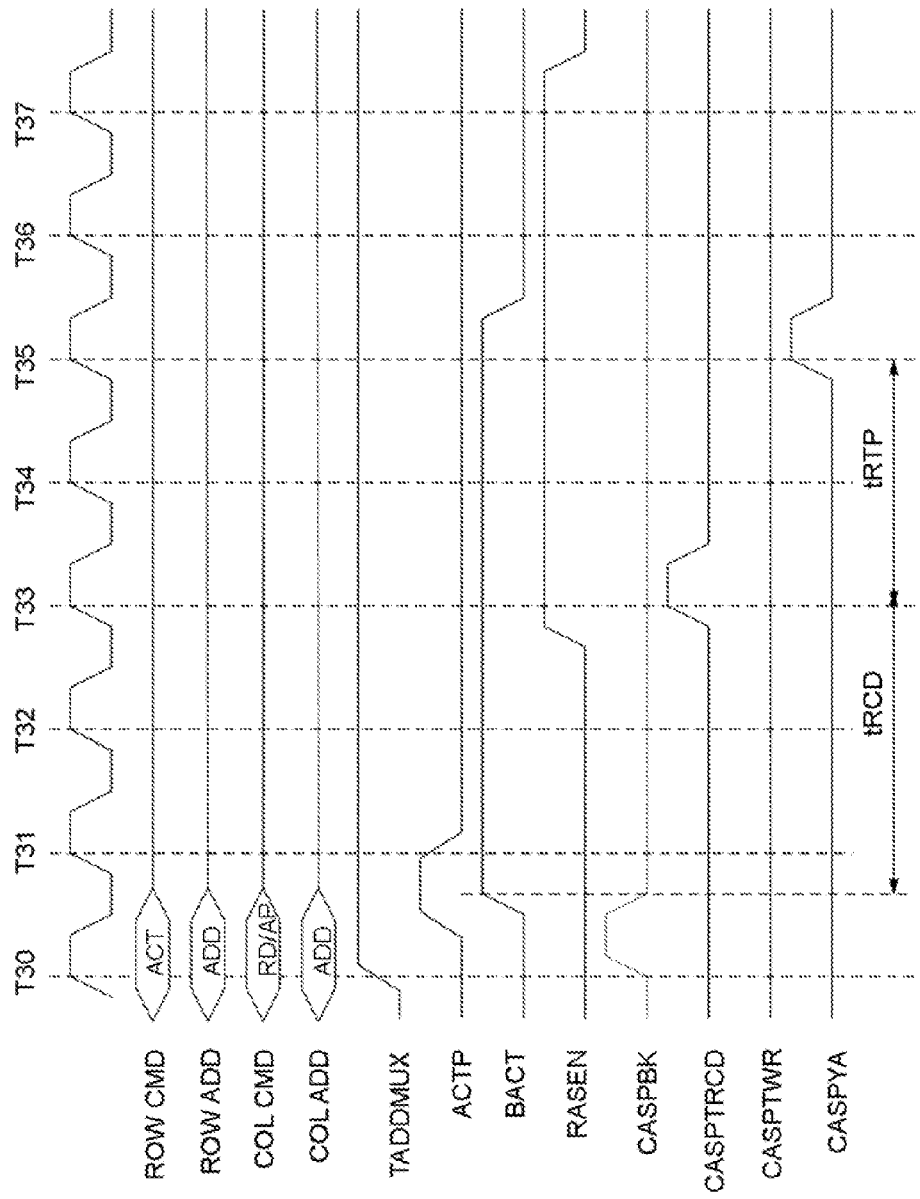

FIG. 13 illustrates that the precharge and read with auto-precharge commands are inputted as row and column commands at the same time, then the read operation for the bank is performed after tRCD, and then the auto-precharge operation for the bank is performed tRTP.

Referring to FIG. 12, in the address multiplexing mode, the row command ROW CMD and the column command COL CMD are simultaneously provided to a bank of the semiconductor memory device at T20 and T21, at which the row address ROW ADD and the column address COL ADD may also be provided at the same time.

The row command decoder 110 may decode the row command ROW CMD indicating the active command, and enable the active signal ACTP at T20~T21.

Accordingly, the bank active controller 135 may enable the bank active signal BACT in response to the active signal ACTP. The bank active signal BACT may keep enabled at T20~T25 until the auto-precharge operation is performed.

The column command decoder 210 may decode the column command COL CMD, and enable the Internal column command CCMD indicating the write with auto-precharge command. The CAS controller 230 may output the enabled CAS pulse signal CASPBK according to the write command, at T20~T21. In this case, the CAS pulse signal CASPBK corresponds to a write signal.

When the bank active signal BACT is enabled, the asynchronous delay unit 251 within the CAS delay controller 250 may delay the CAS pulse signal CASPBK, and enable the delayed precharge signal CASPBKD tRCD after the enablement of the bank active signal BACT, at T23.

After the delayed precharge signal CASPBKD is enabled, the auto-precharge operation for the bank may be additionally performed. The auto-precharge operation may also be supported by the conventional synchronous memory device.

The auto-precharge operation may be performed in response to the CAS pulse signal CASPTWR for the auto-precharge operation, which is enabled tWR after the enablement of the delayed precharge signal CASPBKD. For this operation, the delayed precharge signal CASPBKD may be asynchronously or synchronously delayed to output the CAS pulse signal CASPTWR for the auto-precharge operation at T25.

When the CAS pulse signal CASPTWR for the auto-precharge operation is enabled, the bank active signal BACT may be disabled by the bank active controller 135. For this operation, the CAS pulse signal CASPTWR for the auto-precharge operation may be inputted as the reset signal RST to the NOR gate in the bank active controller 135 shown in FIG. 6.

FIG. 13 illustrates that the precharge and read with auto-precharge commands are simultaneously inputted as the row and column commands after the operation shown in FIG. 12, then the read operation for the bank is performed after tRCD, and then the auto-precharge operation for the bank is performed tWR after the read operation for the bank.

Referring to FIG. 13, the row command decoder 110 may decode the row command ROW CMD indicating the precharge command, and outputs the enabled active signal ACTP at T30~T31.

When the active signal ACTP is enabled, the bank active signal BACT may be enabled by the operation of the bank active controller 135. The bank active signal BACT maintains the enabled state until the auto-precharge operation is performed, at T30~T35.

The column command decoder 210 decodes the column command COL CMD and outputs the enabled internal column command CCMD, for example, a write with auto-precharge command. The CAS controller 230 outputs the enabled CAS pulse signal CASPBK according to the internal column command at T30~T31. In this case, the CAS pulse signal CASPBK corresponds to a read command.

The asynchronous delay unit 241 within the CAS delay controller 250 latches the CAS pulse signal CASPBK. When the bank active signal BACT is enabled, the precharge signal CASPBK may be delayed by the delay time of the bit line sense amplifier, and the delayed precharge signal CASPBKD may be enabled at T33. The delay time corresponds to tRCD.

After the delayed precharge signal CASPBKD is enabled, an auto-precharge operation may be additionally performed. The auto-precharge operation may also be supported by the conventional asynchronous memory device.

The auto-precharge operation may be performed in response to the selected CAS pulse signal CASPYA functioning as an auto-precharge control signal which is enabled when a predetermined time, for example, tRTP passes after the delayed precharge signal CASPBKD, which corresponds to the delayed precharge signal CASPTRCD, is enabled. For this operation, the delayed precharge signal CASPTRCD may be asynchronously or synchronously delayed to output the selected CAS pulse signal CASPYA at T35.

When the selected CAS pulse signal CASPYA is enabled, the bank active signal BACT may be disabled by the bank active controller 135. For this operation, the reset signal RST and the selected CAS pulse signal CASPYA may be inputted to the NOR gate in FIG. 6.

In accordance with an exemplary embodiment of the present invention, the semiconductor memory device and the memory system including the same may perform a normal operation even when row and column commands are independently inputted at the same time, thereby supporting the address multiplexing function which is performed in SRAM or the like.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a memory cell array;
a first address controller configured to receive a first command and a first address and generate a first control signal in response to the first command; and
a second address controller configured to receive a second address and a second command inputted at the same time as the first command, and generate a second control signal in response to the second command.

2. The semiconductor memory device of claim 1, wherein when the first command is an active command and the second command is any one of a read command and a write command, the second control signal is provided to the memory cell array in a first time after the first control signal is enabled.

3. The semiconductor memory device of claim 1, wherein when the first command is a precharge command and the second command is any one of a read command and a write command, the first control signal is provided to the memory cell array in a second time after the second control signal is enabled.

4. The semiconductor memory device of claim 1, wherein the memory cell array comprises a plurality of banks, and the first command and the second command are commands for the same bank corresponding to any one of the plurality of banks.

5. The semiconductor memory device of claim 1, wherein the first address controller comprises:
a first command decoder configured to decode the first command and output an first internal command; and
a first address strobe controller configured to control the timing of the first control signal according to the first internal command and the second control signal.

6. The semiconductor memory device of claim 5, wherein the first address strobe controller comprises:
a delay unit configured to delay the second control signal by the first time; and
an active controller configured to control whether to enable the first control signal according to the first internal command and an output of the delay unit.

7. The semiconductor memory device of claim 6, wherein the delay unit comprises:
an asynchronous delay unit configured to delay the second control signal by a fixed time;
a synchronous delay configured to delay the second control signal by a time which is varied according to a register value; and
a selector configured to select an output of the asynchronous delay unit or the synchronous delay.

8. The semiconductor memory device of claim 5, wherein the first address controller further comprises a first address generator configured to generate a first internal address using a first address inputted from outside, in synchronization with the first control signal.

9. The semiconductor memory device of claim 1, wherein the second address controller comprises:
a second command decoder configured to decode the second command and output a second internal command; and a second address strobe controller configured to generate the second control signal according to the second internal command, and control timing of the second control signal according to the first control signal.

10. The semiconductor memory device of claim 9, wherein the second address strobe controller comprises:
a 2-1$^{st}$ address strobe controller configured to decode the second internal command and generate the second control signal; and
a 2-2$^{nd}$ address strobe controller configured to control the timing of the second control signal according to the first control signal.

11. The semiconductor memory device of claim 10, wherein the 2-2$^{nd}$ address strobe controller comprises:
an asynchronous delay unit configured to delay the second control signal by a fixed delay time after the first control signal is enabled;
a synchronous delay configured to delay the second control signal by a time which is varied according to a register value; and
a selector configured to select an output of the asynchronous delay unit or the synchronous delay, and output the selected output.

12. The semiconductor memory device of claim 11, wherein the asynchronous delay unit comprises:
a latch configured to latch the second control signal;
a delay configured to delay the first control signal by the fixed delay time; and
a signal transmitter configured to transmit an output of the latch according to an output of the delay.

13. The semiconductor memory device of claim 10, wherein the second address controller further comprises a second address generator configured to output the second address as a second internal address according to the second control signal.

14. The semiconductor memory device of claim 13, wherein the second address generator comprises:
a 2-1$^{st}$ internal address generator configured to generate a 2-1$^{st}$ internal address in synchronization with the output timing of the 2-1$^{st}$ address strobe controller; and
a 2-2$^{nd}$ internal address generator configured to generate the second internal address in synchronization with the output timing of the 2-2$^{nd}$ address strobe controller.

15. A memory system comprising:
a memory controller;
a semiconductor memory device; and
a bus comprising a first command bus configured to transmit a first command of the memory controller to the semiconductor memory device and a second command bus configured to transmit a second command of the memory controller to the semiconductor memory device,
wherein the memory controller simultaneously provides the first and second commands to the semiconductor memory device through the first command bus and the second command bus, wherein the semiconductor memory device comprises:
a memory cell array;
a first address controller configured to generate a first control signal for controlling the memory cell array in response to the first command; and
a second address controller configured to generate a second control signal for controlling the memory cell array in response to the second command.

16. The memory system of claim 15, wherein when the first command is an active command and the second command is any one of a read command and a write command, the second control signal is delayed by a first time after the first control signal is enabled, and then provided to the memory cell array.

17. The memory system of claim 15, wherein when the first command is a precharge command and the second command is any one of a read command and a write command, the first control signal is delayed by a second time after the second control signal is enabled, and then provided to the memory cell array.

18. The memory system of claim 15, wherein the first address controller comprises:
a first command decoder configured to decode the first command and output a first internal command; and
a first address strobe controller configured to control the timing of the first control signal according to the first internal command and the second control signal.

19. The memory system of claim 15, wherein the second address controller comprises:
a second command decoder configured to decode the second command and output a second internal command; and
a second address strobe controller configured to generate the second control signal according to the second internal command and control the timing of the second control signal according to the first control signal.

* * * * *